US008537558B2

(12) United States Patent
Su et al.

(10) Patent No.: US 8,537,558 B2

(45) Date of Patent: Sep. 17, 2013

(54) ELECTRONIC MODULE WITH IMPROVED LATCH MECHANISM

(75) Inventors: Ping-Sheng Su, New Taipei (TW); Fan-Bo Meng, Kunshan (CN)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 190 days.

(21) Appl. No.: 13/231,988

(22) Filed: Sep. 14, 2011

(65) Prior Publication Data

US 2012/0063100 A1 Mar. 15, 2012

(51) Int. Cl.
*H05K 7/00* (2006.01)

(52) U.S. Cl.
USPC .............................. 361/747; 361/740; 385/92

(58) Field of Classification Search
USPC .................. 361/728, 732, 736, 747; 385/88, 385/92, 139; 439/152, 160, 348, 349, 352, 439/372
See application file for complete search history.

(56) References Cited

U.S. PATENT DOCUMENTS

| | | | | |
|---|---|---|---|---|
| 6,439,918 | B1 * | 8/2002 | Togami et al. | 439/372 |
| 6,533,603 | B1 * | 3/2003 | Togami | 439/372 |
| 6,744,963 | B2 * | 6/2004 | Hwang | 385/139 |
| 6,758,699 | B1 * | 7/2004 | Hwang et al. | 439/676 |
| 6,851,867 | B2 * | 2/2005 | Pang et al. | 385/88 |
| 6,884,097 | B2 * | 4/2005 | Ice | 439/160 |
| 6,929,403 | B1 * | 8/2005 | Arciniegas et al. | 385/55 |
| 6,976,865 | B2 * | 12/2005 | Wu | 439/352 |
| 7,033,204 | B1 * | 4/2006 | Wang | 439/372 |
| 7,052,306 | B2 * | 5/2006 | Ishigami et al. | 439/372 |
| 7,064,959 | B2 * | 6/2006 | Kim | 361/732 |
| 7,066,746 | B1 * | 6/2006 | Togami et al. | 439/157 |
| 7,077,578 | B2 * | 7/2006 | Lee et al. | 385/88 |
| 7,083,336 | B2 * | 8/2006 | Kim et al. | 385/92 |
| 7,090,527 | B2 * | 8/2006 | Hanley et al. | 439/372 |
| 7,114,984 | B2 * | 10/2006 | Shirk et al. | 439/372 |
| 7,186,134 | B2 * | 3/2007 | Togami et al. | 439/484 |
| 7,201,520 | B2 * | 4/2007 | Mizue et al. | 385/92 |
| 7,212,410 | B2 * | 5/2007 | Larson | 361/726 |
| 7,238,040 | B1 * | 7/2007 | Wu | 439/352 |
| 7,255,484 | B2 * | 8/2007 | Walker et al. | 385/53 |
| 7,261,582 | B2 * | 8/2007 | Wu | 439/352 |
| 7,317,862 | B2 * | 1/2008 | Minota et al. | 385/134 |
| 7,351,090 | B1 * | 4/2008 | Moore | 439/372 |
| 7,364,446 | B2 * | 4/2008 | Kurashima | 439/157 |
| 7,402,070 | B1 * | 7/2008 | Wu | 439/352 |
| 7,445,485 | B1 * | 11/2008 | Wu | 439/352 |
| 7,477,825 | B2 * | 1/2009 | Walker et al. | 385/134 |
| 7,507,111 | B2 * | 3/2009 | Togami et al. | 439/484 |
| 7,517,160 | B2 * | 4/2009 | Miyoshi et al. | 385/92 |
| 7,566,245 | B1 * | 7/2009 | McColloch | 439/607.2 |
| 7,597,590 | B2 * | 10/2009 | McColloch | 439/607.18 |
| 7,648,289 | B2 * | 1/2010 | Miyoshi et al. | 385/92 |
| 7,651,341 | B2 * | 1/2010 | Wu | 439/76.1 |
| 7,690,939 | B2 * | 4/2010 | Wu | 439/352 |

(Continued)

*Primary Examiner* — Ramon Barrera

(74) *Attorney, Agent, or Firm* — Wei Te Chung; Ming Chieh Chang

(57) ABSTRACT

An electronic module (100) comprises a base portion (1) having a receiving space (110), a panel portion (2), a printed circuit board (3) disposed in the base portion and a latch mechanism assembled to the base portion. The latch mechanism includes an actuator member (63), a fastening member (64) connected with one end of the actuator member, a pull tape (65) connected with another end of the actuator member, an elastic member (61) and a slider member (62). The fastening member is assembled to the slider member, and the elastic member is shielding outside the slider member.

20 Claims, 7 Drawing Sheets

(56) References Cited

U.S. PATENT DOCUMENTS

| | | | | |
|---|---|---|---|---|
| 7,712,969 | B2 * | 5/2010 | Song et al. | 385/53 |
| 7,771,225 | B1 * | 8/2010 | Wu | 439/352 |
| 7,955,003 | B2 * | 6/2011 | Teo et al. | 385/92 |
| 8,023,270 | B2 * | 9/2011 | Chen | 361/747 |
| 8,035,975 | B2 * | 10/2011 | Wu | 361/747 |
| 8,064,207 | B2 * | 11/2011 | Wu | 361/747 |
| 2003/0194190 | A1 * | 10/2003 | Huang | 385/92 |
| 2005/0233631 | A1 * | 10/2005 | Wu | 439/352 |
| 2007/0161281 | A1 * | 7/2007 | Wu | 439/352 |
| 2008/0032541 | A1 * | 2/2008 | Reed et al. | 439/352 |
| 2010/0091466 | A1 * | 4/2010 | Wu | 361/747 |
| 2010/0091467 | A1 * | 4/2010 | Wu | 361/747 |

* cited by examiner

ELECTRONIC MODULE WITH IMPROVED LATCH MECHANISM

BACKGROUND OF THE INVENTION

1. Field of the Invention

The present invention generally relates to an electronic module, and more particularly to an electronic module having an improved latch mechanism for high speed signal transmitting.

2. Description of Related Art

SFP (Small Form-factor Pluggable), X-SFP and QSFP are all modules for fiber optic transmission or ordinary signal transmission. All of the modules are of small size or form factor which is important. The smaller the form factor of the module, the less space taken on a printed circuit board to which it couples. A smaller form factor allows a greater number of modules to be coupled onto a printed circuit board to support additional communication channels. However, the smaller form factor makes it more difficult for a user to handle. When such a module embedded in a system fails, it is desirable to replace it, particularly when other communication channels are supported by other modules. To replace a failed module, it needs to be pluggable into a module receptacle. While, plugging in a new module is usually easy, it is more difficult to remove the failed module because of other components surrounding it.

Hence, an improved electronic module is highly desired to overcome the disadvantages of the related art.

SUMMARY OF THE INVENTION

Accordingly, an object of the present invention is to provide an electronic module having an improved latch mechanism to be separated from a complementary connector expediently.

In order to achieve the object set forth, an electronic module comprises a base portion having a receiving space, a panel portion, a printed circuit board disposed in the base portion and a latch mechanism assembled to the base portion. The latch mechanism includes an actuator member, a fastening member connected with one end of the actuator member, a pull tape connected with another end of the actuator member, an elastic member and a slider member. The fastening member is assembled to the slider member, and the elastic member is shielding outside the slider member.

Other objects, advantages and novel features of the invention will become more apparent from the following detailed description when taken in conjunction with the accompanying drawings.

DETAILED DESCRIPTION OF THE INVENTION

Figure 1:
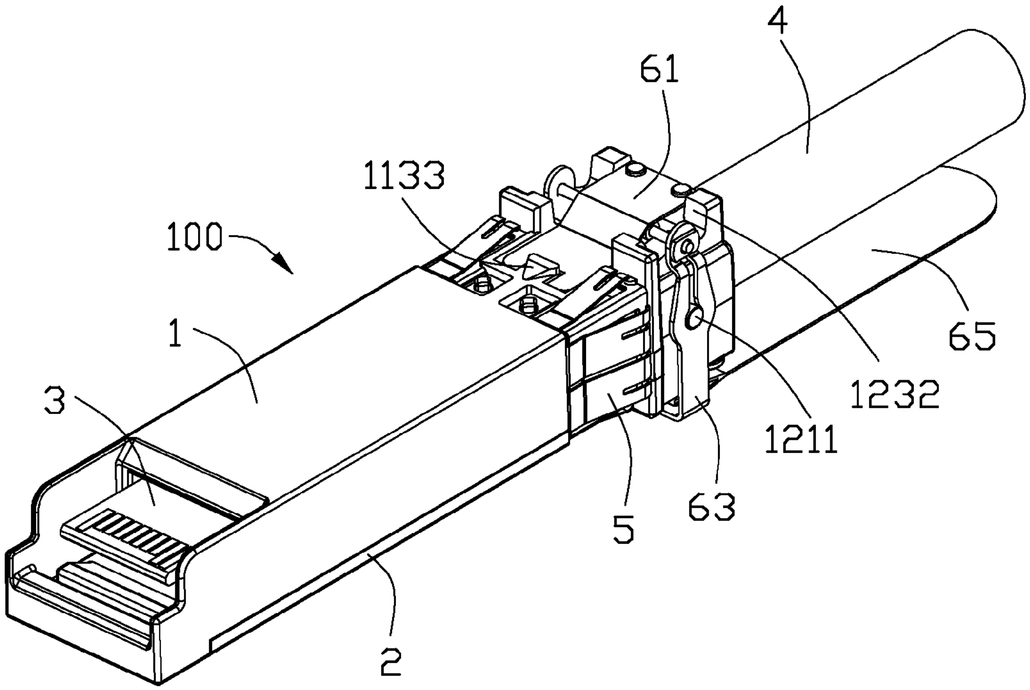
FIG. 1 is an assembled, perspective view of an electronic module of a first embodiment in accordance with the present invention.
Figure 2:
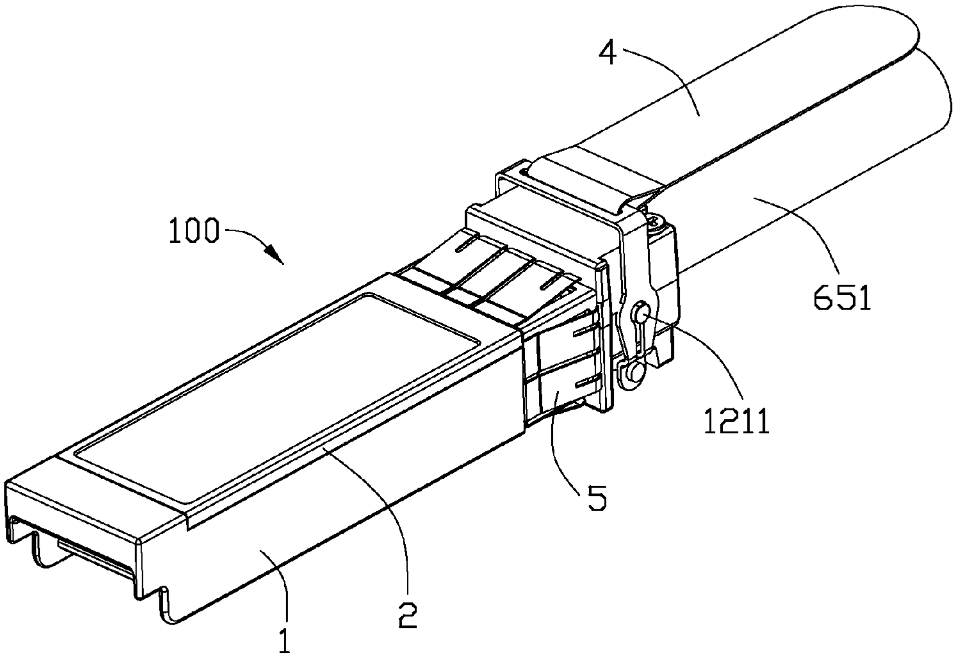
FIG. 2 are another views similar to FIG. 1, but viewed from another aspects.

Reference will now be made in detail to the preferred embodiment of the present invention.

Referring to FIGS. 1-5, the electronic module 100 comprises a housing (not numbered) composed of a conductive base portion 1 and a conductive panel portion 2, a printed circuit board 3, a cable 4, a metallic gasket 5 and a latch mechanism (not numbered).

Referring to FIGS. 1-4, in the first embodiment of the present invention, the base portion 1 is die-cast or other metallic plated body, and includes a primary body portion 11 and a first mounting portion 12 rearward extending from back face of the primary body portion 11. The primary body portion 11 has a pair of lateral walls 111, 112 and a bottom wall 113 joining to lower sections of the lateral walls 111, 112 to form a receiving space 110 with an upper window (not numbered). Rear sections of the pair of the lateral walls 111, 112 define a pair of first depression portions 1110. A front section of the bottom wall 113 is cut to form an outlet 1131. A rear section of the bottom wall 113 defines a first channel 1132 located in a middle area thereof, with a tab 1133 formed in the front and middle of the first channel 1132. A pair of sunken portions 1134 are defined in two lateral areas of the rear section of the bottom wall 113, and arranged at outward of the first channel 1132. A pair of indentations 1135 are arranged at inward of the corresponding sunken portions 1134, and the indentations 1135 are deeper than the sunken portions 1134. A pair of protrusions 1136 are respectively formed in a rear corners (not numbered) of the sunken portions 1134, a pair of tiny posts 1137 respectively are formed in the middle area of the pair of indentations 1135. The primary body portion 11 further has a beam portion 114 with substantially L-shaped cross-section interconnecting distal portions of the pair of the lateral walls 111, 112.

The first mounting portion 12 has a pair of side walls 121 and a lower wall 122 to corporately form a first semi-circular cavity 1201, and a deeper first position slot 1202 is located in front of the first semi-circular cavity 1201. A second channel 1221 is defined in a middle area of the lower wall 122 and communicated with the first channel 1132 of the primary body portion 11. A pair of guiding members 123 are respectively formed on lateral areas of the lower wall 122. Each guiding member 123 has a lengthways guiding passage 1232 facing downwards, and a conjoining portion 124 is arranged between the pair of guiding members 123. The conjoining portion 124 is connecting with the two guiding members 123 and located behind the first mounting portion 12. The conjoining portion 124 has a smaller height than the guiding members 123, and a pair of combining holes 1241 are defined on the conjoining portion 124. A pair of pivot members 1211 are respectively formed on exterior surfaces of the pair of side walls 121. A pair of first screw holes 1212 are respectively recessed downwards from upper surfaces of rear sections of side walls 121.

The panel portion 2 is die-cast or a metallic plated body, and includes a secondary body portion 21 and a second mounting portion 22 extending rearwards from a back face of the secondary body portion 21. The secondary body portion 21 has a planar board member 213 and a pair of flange members 211, 212 formed on lateral sides thereof. The board member 213 defines a second depression portion 2130 on an upper section thereof and a vertical wall 2131 on a front section thereof. The board member 213 has a protrusion portion 2132 on a front end thereof. A pair of supporting posts 2133 are located behind the vertical wall 2131, and each supporting post 2133 defines a second screw hole 2134.

The second mounting portion 22 also has a pair of side walls 221 and a upper wall 222 to corporately form a second semi-circular cavity 2201, and a deeper second position slot 2202 located in front of the second semi-circular cavity 2201. A pair of through holes 2211 are respectively defined in a rear section of the side walls 221.

The printed circuit board 3 includes a substrate 30, a plurality of first conductive pads 31 arranged on a front section of the substrate 30 and a plurality of second conductive pads 32 located on rear section thereof. A pair of positioning holes 33 are disposed neighboring to a front segment of the substrate 30.

The cable 4 includes an outer insulative jacket (not shown), and a number of wires (not shown) enclosed in the insulative jacket and insulated from each other. A front section of the cable 4 is electrically connected with the second conductive pads 32 of the printed circuit board 3, and an insulator 9 is molded to a front section of the cable 4 neighboring to the printed circuit board 3.

The gasket 5 is made of sheet metal and configured to rectangular-shaped frame portion 51, including a pair of vertical sides 5*a*, 5*b*, an upper side 5*c* joining upper edges of the pair of vertical sides 5*a*, 5*b*, and a pair of lower sub-walls 5*d* respectively extending inwardly from lower edges of the pair of vertical walls 5*a*, 5*b*. A lower outlet 50 is formed between the pair of lower sub-walls 5*d* for assembling easily. A number of detents 52, 53 are separated into a layer of first (outward) detents 53 and a layer of second (inward) detents 52 are formed on the frame portion 51. The layer of first detents 53 extend rearward and outward from front edge of the frame portion 51, while the layer of second detents 52 are stamped of the frame portion 51 and outward deflect the frame portion 51. The first detents 53 are shielding the second detents 52, therefore to achieve better Electro-Magnetic Interference (EMI) suppressing effect.

A pair of fixing portions 54 are formed on free ends of the pair of lower sub-walls 5*d*, and extending breadthwise into the lower outlet 50. Each fixing portion 54 has a circular hole 541 in a central area thereof. Each sub-wall 5*d* has a semi-circular cutout 542 located in a distal end thereof to accommodate corresponding protrusions 1136 in the sunken portions 1134.

The latch mechanism includes an elastic member 61, a slider member 62, an actuator member 63, a fastening member 64, a pull tape 65. The elastic member 61 is made of sheet metal and has an invariable width along a transverse direction, and comprises a horizontal coupling portion 612 in the front thereof, a horizontal positioning portion 613 and a contacting portion 614 slantways connecting the coupling portion 612 and the positioning portion 613. The positioning portion 613 is lower than the coupling portion 612 along the up-to-down direction, and the positioning portion 613 defines a pair of fixing holes 6131 in a rear section thereof. An opening 6120 is recessed rearwards from a front end of the coupling portion 612.

In the first embodiment of the present invention, the slider member 62 is a hollow cylinder. The fastening member 64 is of rod-shaped, and includes a bolt member 641 and a nut 642. The slider member 62 is assembled onto the bolt member 641 of the fastening member 64.

The actuator member 63 is configured to doorframe-shaped, and includes a doorhead 631 and two door jambs 632. A slit 633 is formed in the doorhead 631 along the transverse direction. Each door jamb 632 defines a first positioning hole 6321 in a middle section thereof, and a pair of mounting holes 6322 are defined through the lower ends of the door jambs 632, the first positioning hole 6321 is communicated with the corresponding mounting hole 6322 on a same side.

The pull tape 65 is a soft belt with a certain width and comprises opposite ends, the opposite ends thereof are stuck to each other to form a handling portion 651 for being pulled by an operator to pull the actuator mechanism rearwardly.

Figure 3:
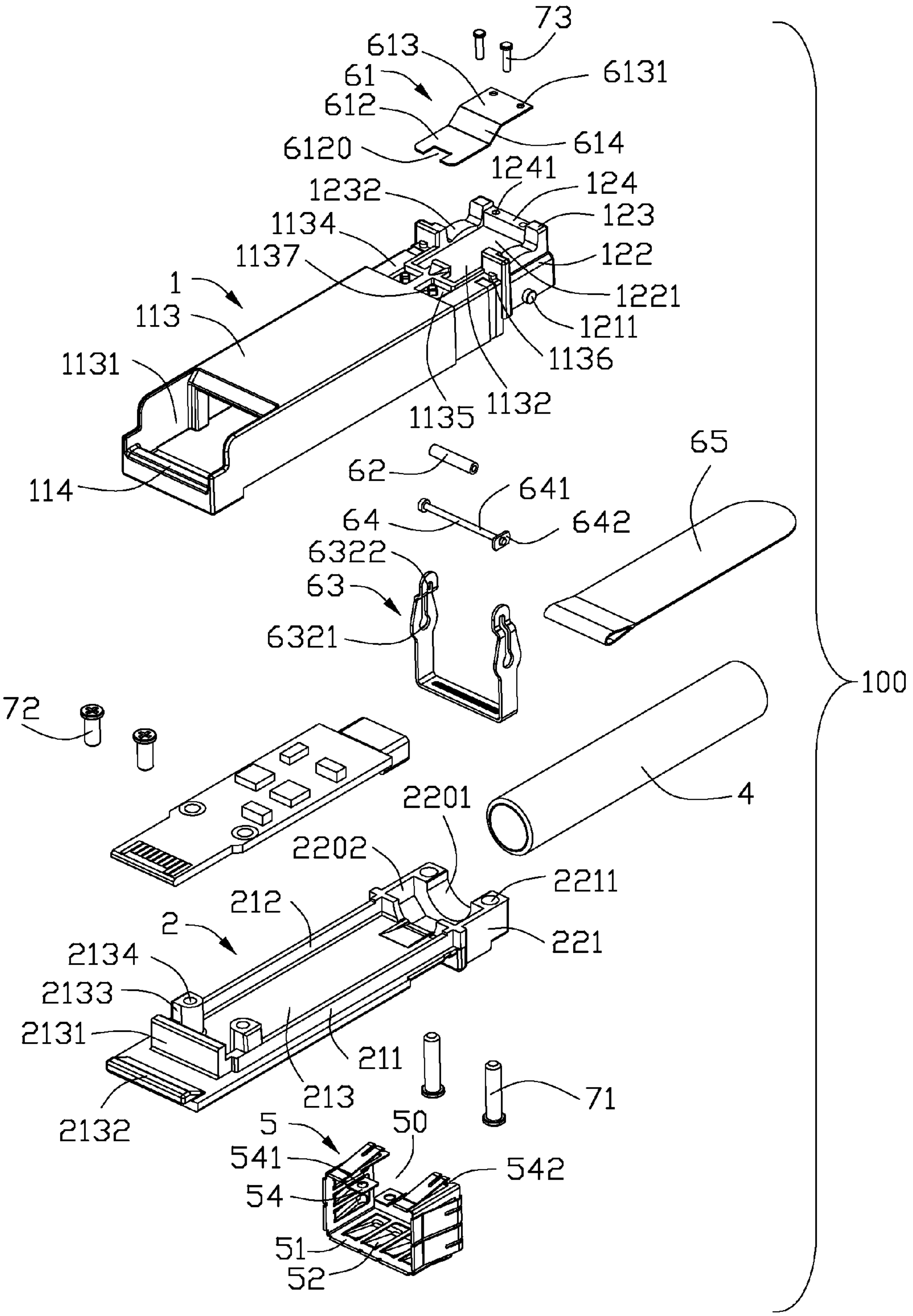
FIG. 3 is an exploded, perspective view of the electronic module shown in FIG. 1.
Figure 4:
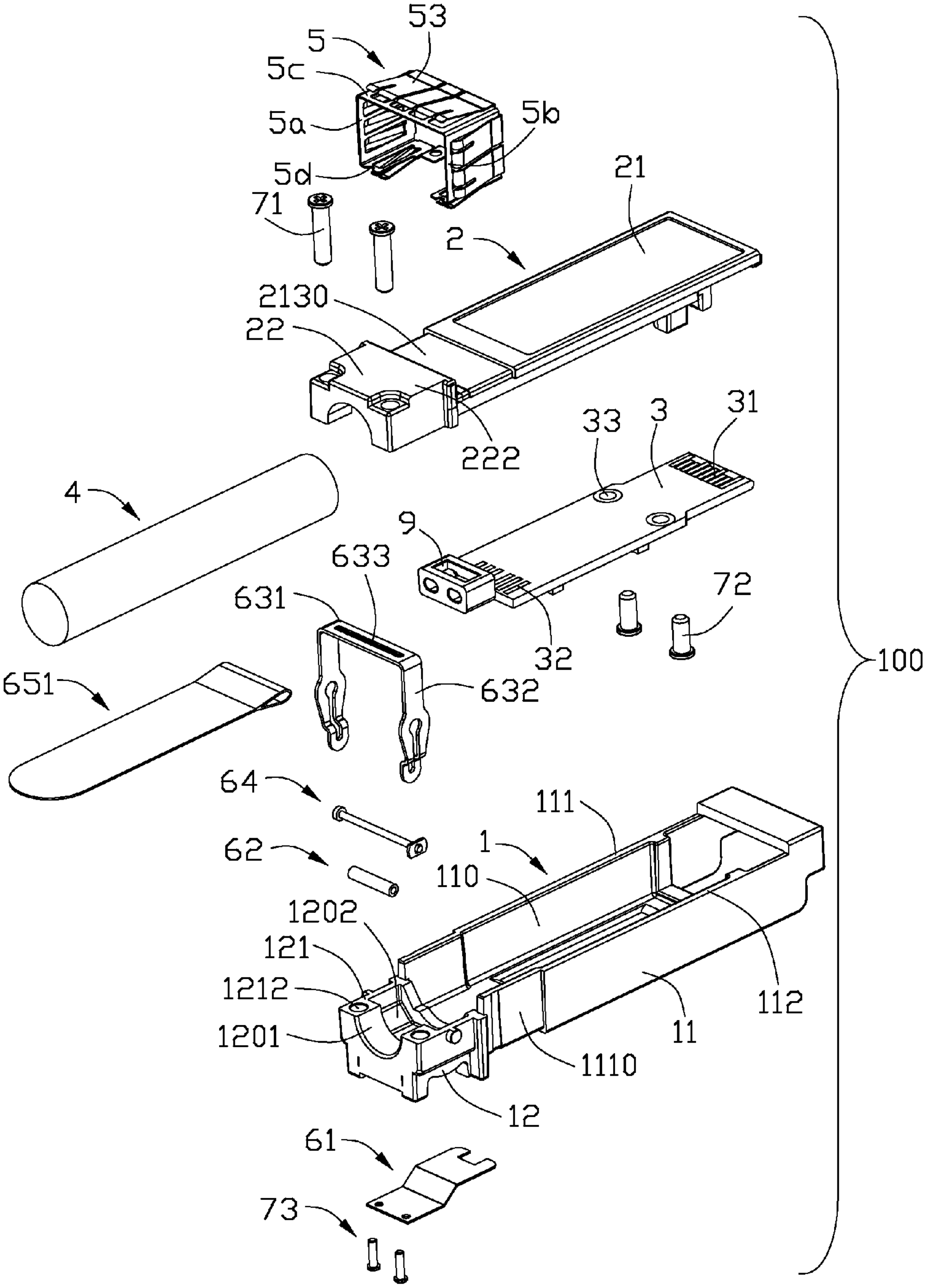
FIG. 4 is a view similar to FIG. 3, but viewed from another aspect.

Referring to FIGS. 3-4, in assembly, the insulative jacket of a front segment of the cable 4 is decorticated, and then the wires exposed outside are soldered to the second conductive pads 32 of the printed circuit board 3, and an insulator 9 is over-molded on the front section of the cable 4.

The cable 4 is pressed into the first position slot 1202 of the base portion 1. The panel portion 2 is assembled to the base portion 1, with a pair of lateral flange members 211, 212 thereof inserted into the receiving space 110. The printed circuit board 3 is disposed on the supporting posts 2133 of the panel portion 2 and accommodated in the receiving space 110 of the base portion 1. The positioning holes 33 are aligning with the relative second screw holes 2134 in the supporting posts 2133, and a pair of second screw members 72 are inserted into the positioning holes 33 and the second screw holes 2134 to fasten the printed circuit board 3 and the panel portion 2 together.

The protrusion portion 2132 is supported by the beam portion 114 of the base portion 1, the cable 4 is partially received in the second position slot 2202 of the panel portion 2. The pair of through holes 2211 of the panel portion 2 are aligning with the pair of first screw holes 1212 of the base portion 1, then a pair of first screw members 71 are inserted into the through holes 2211 and the first screw holes 1212 to fasten the panel portion 2 and the base portion 1 together.

The gasket 5 is assembled to an outer surface of the housing, with the pair of vertical sides 5*a*, 5*b* thereof located in the pair of first depression portions 1110 of the base portion 1, the upper side 5*c* thereof located in the second depression portion 2130 of the panel portion 2, the pair of lower sub-walls 5*d* are located in the pair of sunken portions 1134, the fixing portions 54 are accommodated in the corresponding indentations 1135. The pair of tiny posts 1137 are inserted into the pair of through holes 541 of the pair of fixing portions 54 and then soldered therein. The protrusion members 1136 are received in the corresponding cutouts 542 of the lower sub-walls 5*d*.

The actuator member 63 is assembled to the first mounting portion 12 of the base portion 1, and the pair of pivot members 1211 of the first mounting portion 12 are received in the pair of first positioning holes 6321 of the door jambs 632 of the actuator member 63. The slider member 62 is assembled to the fastening member 64, and then the combined unit of the slider member 62 and the fastening member 64 is placed in the second channel 1221 of the first mounting portion 12. The pair of mounting holes 6322 located in the end section of the door jambs 632 are aligning with the bolt member 641 of the fastening member 64, and the bolt member 641 is inserted through the pair of mounting holes 6322 and slidable received in the guiding passage 1232, then the nut 642 is finally assembled to end of the bolt member 641. The pull tape 65 is connected with the actuator member 63, and inserted into the slit 633 of the actuator member 63, with the free ends stuck to each other to form the handling portion 651. The fastening member 64 is connected to one end of the actuator member 63, and the pull tape 65 is connected with another opposite end of the actuator member 63.

Then the elastic member 61 is situated in the second channel 1221 of the first mounting portion 12, with the positioning portion 613 being adjacent to the conjoining portion 124, and the combining holes 1241 aligning with the corresponding fixing holes 6131, a pair of third screw members 73 are inserted into the combining holes 1241 and the fixing holes 6131 to settle the elastic member 61 on the base portion 1. The slider member 62 is shielded by the elastic member 61 and adjacent to the contacting portion 614, and the opening 6120 in the coupling portion 612 of the elastic member 61 is facing towards the tab 1133 in the first channel 1132.

When the electronic module 100 mating with the complementary connector (not shown), the layer of first detents 53 contact with a cage (not shown) of the complementary connector to reduce EMI nearby an interface between a front segment of the complementary connector and rear portions of the primary body portion 11 of the base portion 1 and the secondary body portion 21 of the panel portion 2, and the layer of second detents 52 may further prevent EMI leakage through slits between adjacent detents of the layer of first detents 53.

While the electronic module 100 disengaging away from the complementary connector, just exert a pulling force on the handling portion 651 of the pull tape 65 to promote the columned slider member 62 moving forwardly and pushing the contacting portion 614 of the elastic member 61, then the elastic member 61 moving downwards to reversely push the cage of the complementary connector moving outwards to depart from the electronic module 100.

Figure 5:
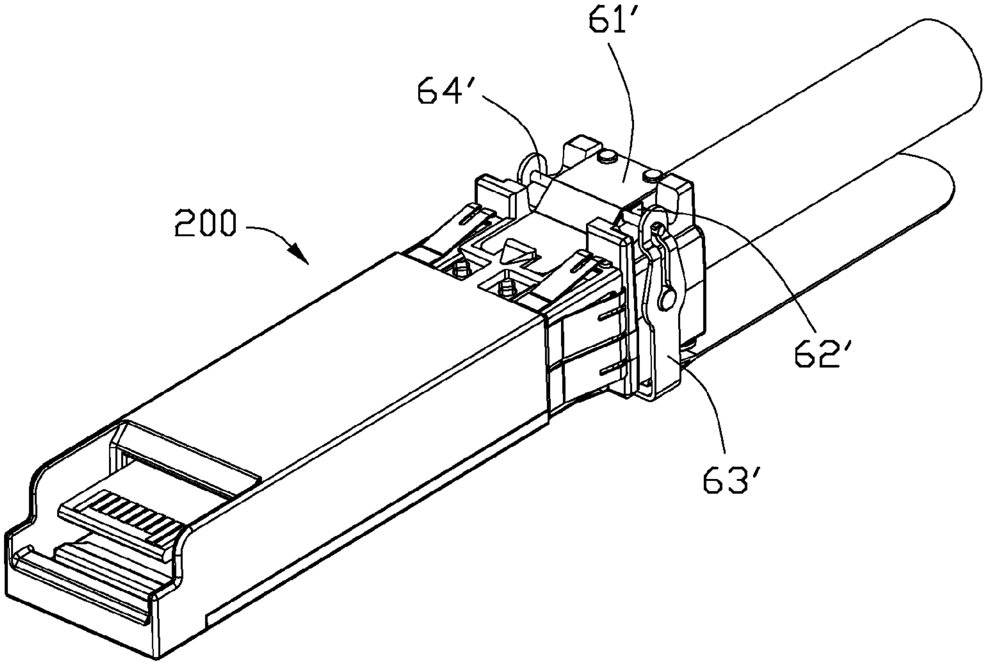
FIG. 5 is a perspective view of an electronic module of a second embodiment in according with the present invention.
Figure 6:
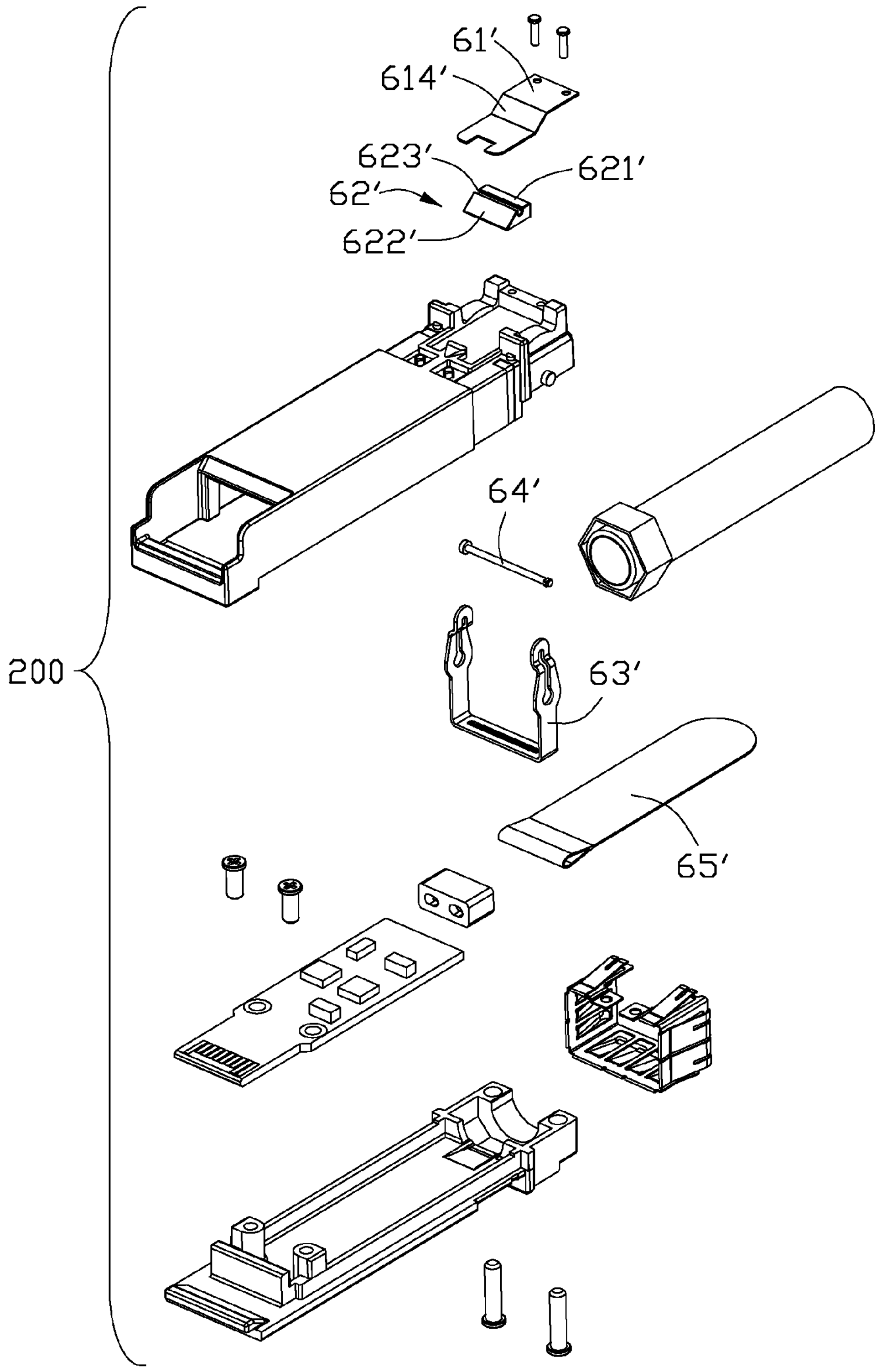
FIG. 6 is an exploded, perspective view of the electronic module shown in FIG. 5.
Figure 7:
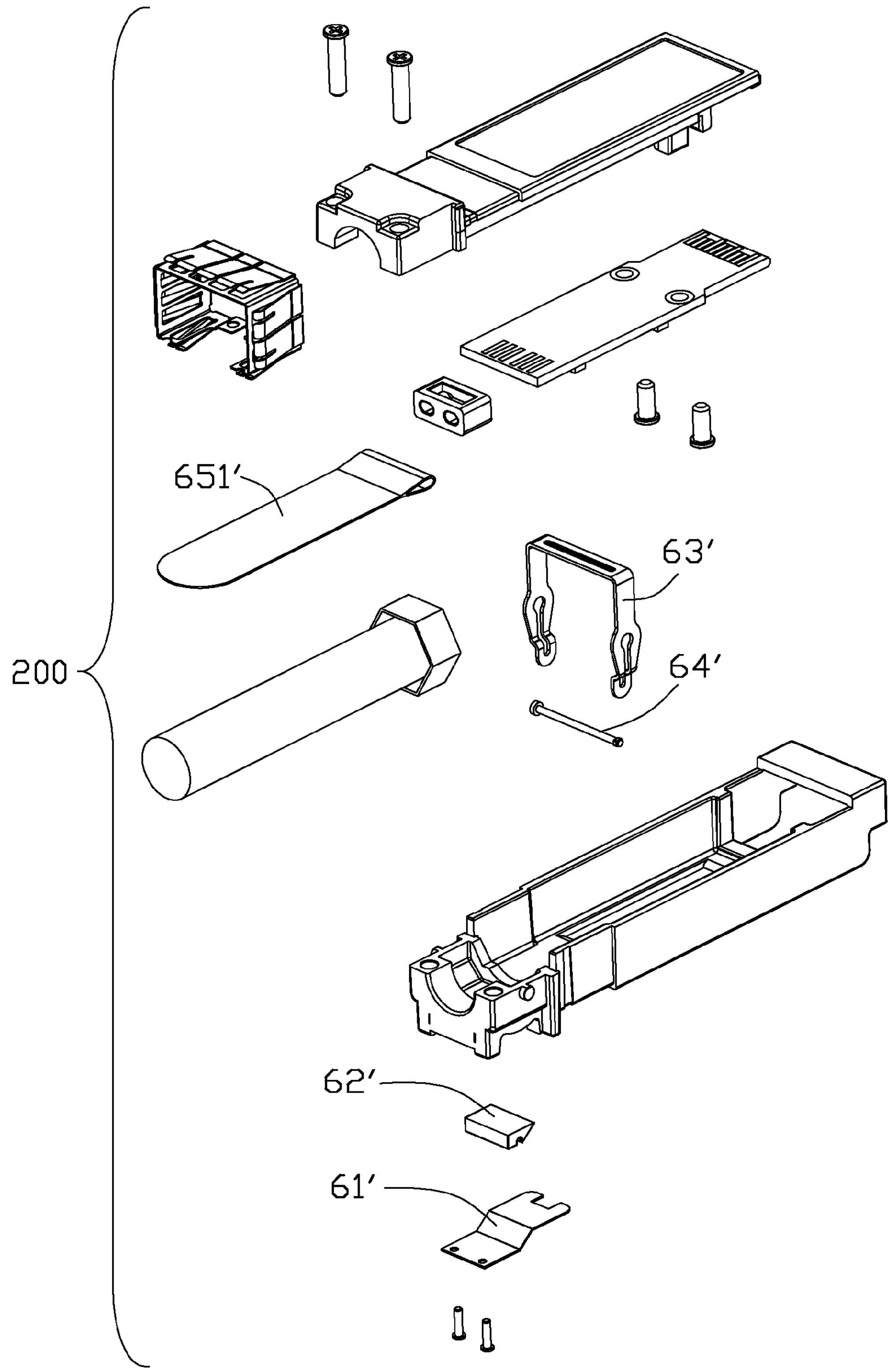
FIG. 7 is a view similar to FIG. 6, but taken from a different aspect.

Referring to FIGS. 5 to 7, an electronic module 200 of a second embodiment in accordance with the present invention is illustrated. The electronic module 200 is similar to the electronic module 100, excepted with different latch mechanisms, and detailed description of the same elements and their relations of the electronic module 200 are omitted hereby. The latch mechanism of the electronic module 200 comprises an elastic member 61', a slider member 62', an actuator member 63', a fastening member 64' and a pull tape 65'. And the latch mechanism of the electronic module 200 is similar to the latch mechanism of the electronic module 100 except the slider member 62' different from the slider member 62. In the second embodiment in accordance with the present invention, the slider member 62' comprises a substantially rectangular shaped body portion 621' and a wedge-shaped portion 622' extending forwards from a front surface of the body portion 621'. The body portion 621' has a transverse groove 623' neighboring to the wedge-shaped portion 622', and the fastening member 64' is received in the groove 623', the elastic member 61' is shielding on the slider member 62'.

While the electronic module 200 disengaging away from the complementary connector, just exert a pulling force on the handling portion 651' of the pull tape 65' to promote the slider member 62' moving forwardly and pushing the contacting portion 614' of the elastic member 61', then the elastic member 61' moving downwards to reversely push the cage of the complementary connector moving outwards to depart from the electronic module 200.

It is to be understood, however, that even though numerous characteristics and advantages of the present invention have been set forth in the foregoing description, together with details of the structure and function of the invention, the disclosure is illustrated only, and changes may be made in detail, especially in matters of shape, size, and arrangement of parts within the principles of the invention to the full extent indicated by the broad general meaning of the terms in which the appended claims are expressed.

What is claimed is:

1. An electronic module, comprising:

a base portion having a receiving space;

a panel portion;

a printed circuit board disposed in the base portion; and a latch mechanism assembled to the base portion and having an actuator member, a fastening member connected with one end of the actuator member, a pull tape connected with another end of the actuator member, an elastic member and a slider member;

wherein the fastening member is assembled to the slider member, and the elastic member is shielding outside the slider member.

2. The electronic module as claimed in claim 1, wherein the elastic member is made of sheet metal, and comprises a horizontal coupling portion in the front thereof, a horizontal positioning portion and a contacting portion slantways connecting the coupling portion and the positioning portion.

3. The electronic module as claimed in claim 2, wherein the slider member is adjacent to an interior surface of the contacting portion.

4. The electronic module as claimed in claim 3, wherein the positioning portion is lower than the coupling portion along the up-to-down direction, and the positioning portion defines a pair of fixing holes in a rear section thereof.

5. The electronic module as claimed in claim 4, further comprising a pair of screw members inserted into the fixing holes to fasten the elastic member and the base portion.

6. The electronic module as claimed in claim 3, wherein an opening is recessed rearwards from a front end of the coupling portion, and the opening is facing towards a tab on the base portion.

7. The electronic module as claimed in claim 3, wherein a pair of guiding members are respectively formed on lateral sides of the base portion, and each guiding member has a lengthways guiding passage facing downwards, and a conjoining portion is arranged between the pair of guiding members.

8. The electronic module as claimed in claim 7, wherein the positioning portion is adjacent to the contacting portion.

9. The electronic module as claimed in claim 3, wherein the slider member is a hollow cylinder, and the fastening member is inserted into the slider member.

10. The electronic module as claimed in claim 3, wherein the slider member comprises a substantially rectangular shaped body portion and a wedge-shaped portion extending forwards from a front surface of the body portion.

11. The electronic module as claimed in claim 10, wherein the body portion has a transverse groove neighboring to the wedge-shaped portion, and the fastening member is received in the groove.

12. The electronic module as claimed in claim 2, wherein the base portion comprises a first primary body portion and a first mounting portion rearward extending from a back face of the primary body portion, and the panel portion includes a second primary body portion and a second mounting portion rearward extending from the secondary body portion.

13. The electronic module as claimed in claim 12, wherein the panel portion defines a pair of flange members formed on lateral sides thereof, and the flange members are located inside of corresponding lateral walls of the base portion.

14. The electronic module as claimed in claim 12, wherein the first primary body portion defines a beam portion with substantially L-shaped cross-section interconnecting free end portions of a pair of the lateral walls thereof, the second body portion with a protrusion portion formed at forward end thereof and disposed on the beam portion.

15. The electronic module as claimed in claim 12, wherein the first mounting portion defines a first semi-circular cavity, the second mounting portion defines a second semi-circular cavity, and wherein a cable is inserted into the receiving space via the first and second cavities.

16. An electronic module for use within a cage, comprising:

a case defining a receiving cavity therein and opposite first and second exterior horizontal faces in a vertical directions;

a mating port defined in a front portion of the receiving cavity;

a cable connected to a rear portion of the receiving cavity;

a locking tab formed on the first exterior horizontal face;

an elastic member mounted upon the first exterior horizontal face intimately behind the locking tab; and an actuator member assembled to the case in a pivotal manner about a horizontal transverse axis with a pull section around the second exterior horizontal face and a slider member around the first exterior horizontal face under condition that said pull section and said slider member are moved oppositely; wherein when the pull section is moved rearwardly, the slider member is corresponding moved forwardly to forcibly deflect the elastic member to move outwardly away from the first exterior horizontal face for outwardly deflecting the cage to release the locking tab from the cage.

17. The electronic module as claimed in claim 16, wherein the elastic member defines in a cantilevered manner a rear fixed end fastened to the case, and a front free end located by two lateral sides of the locking tab and actuated by the slider member to be outwardly moved during pivotal movement of the actuator member.

18. The electronic module as claimed in claim 16, further including a pull tape linked to and behind the pull section to finger grasping.

19. The electronic module as claimed in claim 16, wherein said slider member surrounds a fastening member which grips the actuator member on the first exterior horizontal face.

20. The electronic module as claimed in claim 19, wherein said slider member is of a round tubular type rather than a block type.

* * * * *